(12) United States Patent (10) Patent No.: US 6,420,916 B1
Freeman (45) Date of Patent: Jul. 16, 2002

(54) PHASE LOCKED LOOP FILTER UTILIZING A TUNED FILTER

(75) Inventor: Richard A. Freeman, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 453 days.

(21) Appl. No.: 08/906,676

(22) Filed: Aug. 5, 1997

(51) Int. Cl.[7] .............................. H03L 7/06; H03K 5/00
(52) U.S. Cl. ........................................ 327/156; 327/553
(58) Field of Search ................................ 327/552, 553, 327/554, 559, 558, 156

(56) References Cited

U.S. PATENT DOCUMENTS

| | | | |
|---|---|---|---|
| 4,316,108 A | * 2/1982 | Rogers, Jr. ................. | 327/553 |
| 4,456,895 A | 6/1984 | Landt ......................... | 333/174 |
| 4,642,573 A | 2/1987 | Noda et al. ................. | 329/50 |
| 4,653,117 A | 3/1987 | Heck ........................... | 455/209 |
| 4,665,560 A | 5/1987 | Lange ......................... | 455/249 |
| 4,672,632 A | 6/1987 | Andersen .................... | 375/57 |
| 5,003,621 A | 3/1991 | Gailus ......................... | 455/209 |
| 5,091,921 A | 2/1992 | Minami ....................... | 375/88 |
| 5,175,881 A | 12/1992 | Mita et al. ................... | 455/234 |
| 5,239,685 A | 8/1993 | Moe et al. ................... | 455/73 |

OTHER PUBLICATIONS

Gocal et al "Analysis and Design of Tracking Filters", IEEE Transactions on Circuits and Systems, vol. CAS–27, No. 1, Jan. 1980, pp. 45–50.*
Gregory Gocal et al., "Analysis and Design of Tracking Filters", IEEE Transactions on Circuits and Systems, vol. CAS–27, No. 1, Jan. 1980.*

* cited by examiner

Primary Examiner—Dinh T. Le
(74) Attorney, Agent, or Firm—Nathan O. Jensen; Kyle Eppele

(57) ABSTRACT

A phase locked filter can utilize a divider to provide a source signal. The phase locked filter utilizes a phase comparator circuit to tune a voltage-tuned band pass filter. The voltage-tuned band pass filter as a phase response, wherein the phase difference between the input and the output of the band pass filter is zero when the source signal is provided at the center frequency. The phase comparator circuit adjusts the center frequency of the band pass filter to phase lock the source signal from the divider. In this way, the divider can be utilized to provide a clean source signal without a large amount of noise. The phase comparator circuit preferably includes a phase detector or a phase comparator and an integrator. The voltage-tuned band pass filter preferably includes a varactor.

20 Claims, 3 Drawing Sheets

US 6,420,916 B1

PHASE LOCKED LOOP FILTER UTILIZING A TUNED FILTER

FIELD OF THE INVENTION

The present invention relates to the generation of frequency signals in communication applications such as very-high frequency (VHF) radios and ultra-high frequency (UHF) radios. More particularly, the present invention relates to a phase locked loop (PLL) filter which utilizes a tuned filter.

BACKGROUND OF THE INVENTION

Wireless devices, such as, radios, often require several sources of waveforms or signals having particular characteristics. For example, aircraft receive and transmit radios often require several signals at specific frequencies and amplitudes to perform receiving, transmitting, mixing, tuning, modulating, and demodulation operations. Heretofore, wireless devices have relied on several oscillators or voltage-controlled oscillators (VCOs) to generate the signals at several specific frequencies. Oscillators and voltage-controlled oscillators are nonrotating devices capable of producing an output signal having a frequency determined by the characteristics of the device. Oscillators tend to be bulky and expensive.

Digital dividers or prescalers provide a convenient and inexpensive apparatus for generating wide band signals from a single voltage-controlled oscillator. However, digital dividers tend to be noisier than voltage-controlled oscillators. The noise associated with the divider prevents it from being used in certain circumstances as a signal source. For example, signals from digital dividers are too noisy to be used as transmit signals. The noise from the digital divider can also create spurious off-carrier frequency signals.

Thus, there is a need to reduce the number of oscillators utilized in a communication system, such as, in receiving and transmitting portions of a ratio. Further still, there is a need for an apparatus which allows a digital divider to be utilized as a frequency signal source. Even further still, there is a need for an apparatus which allows a digital divider to provide transmit signals.

SUMMARY OF THE INVENTION

The present invention relates to a phase locked filter including a first signal splitter having a source input, a first output, and a second output; a band pass filter; a second signal splitter having a filter input, a third output, and a fourth output; and a phase control circuit. The band pass filter has a signal input, a signal output, and a control input. The signal input is coupled to the first output. The band pass filter has a frequency response in accordance with a control signal at the control input. The filter input is coupled to the signal output. The phase control circuit has a first phase input, a second phase input, and a phase output. The first phase input is coupled to the second output, and the second phase input is coupled to the third output. The phase output is coupled to the control input.

The present invention further relates to a phase locked filter for use in a frequency synthesizer which includes a divider having a divider output. The phase locked filter includes a filter and a phase comparator circuit. The filter has a filter input, a control input, and a filter output. The filter input is coupled to the divider output. The filter has a frequency response related to a chosen frequency indicated by a control signal provided at the control input. The filter has a phase response related to the chosen frequency. The phase comparator circuit has a first phase input, a second phase input, and a phase output. The first phase input is coupled to the divider output. The second phase input is coupled to the filter output. The phase output is coupled to the control input. The phase comparator provides the control signal at the phase output to reduce a difference in phase between signals at the first phase input and at the second phase input.

The present invention still further relates to a phase locked filter for use in a frequency synthesizer. The phase locked filter includes a filter means for filtering a signal at an input, and a phase comparator means for receiving the signal and a filtered signal. The filter means provides the filtered signal at an output in accordance with a band pass frequency response related to a center frequency indicated by a control signal provided at a control input. The phase comparator means venerates the control signal in accordance with a phase difference between the signal and the filtered signal. The filter means has a phase response of zero at the center frequency. The phase comparator provides the control signal at the phase output to reduce the phase difference.

In one aspect of the present invention, a phase locked loop employs a voltage-tuned filter to reduce noise associated with a frequency signal provided by a divider. The voltage-tuned filter is controlled by a phase comparator which adjusts the center frequency of the band pass filter in accordance with the phase difference before and after the filter. The filter is preferably a band pass filter which has a zero-degree phase response at the center frequency and a greater phase response as the frequency shifts away from the center frequency. Therefore, the phase comparator adjusts the center frequency of the band pass filter to match the frequency signal provided by the divider.

According to another aspect of the present invention, the band pass filter is comprised of an inductor and a varactor. The varactor has a control input coupled to the phase comparator. The phase locked loop can be utilized with a divider or a direct digital synthesizer (DDS) to generate a frequency signal suitable for transmission by a radio, such as, a VHF or UHF aircraft radio.

BRIEF DESCRIPTION OF THE DRAWINGS

The invention will hereafter be described with reference to the accompanying drawings, wherein like numerals denote like elements, and.

DETAILED DESCRIPTION OF THE PREFERRED EXEMPLARY EMBODIMENTS

Figure 1:
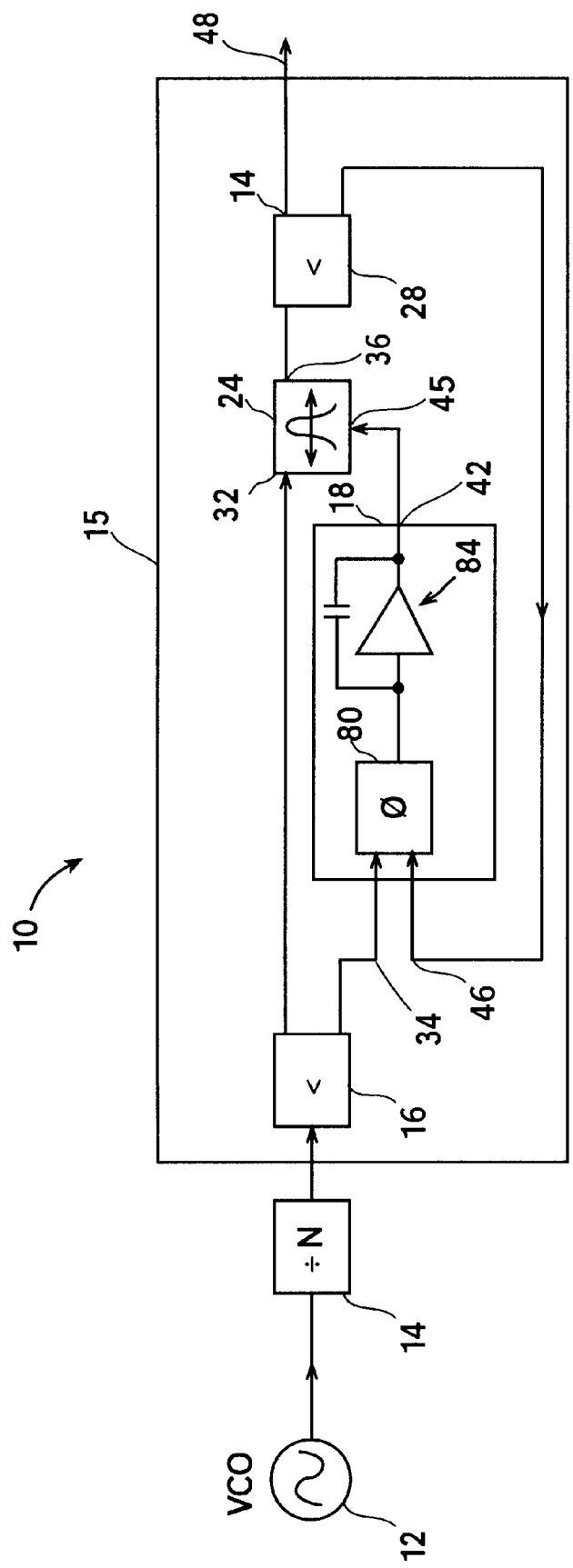
FIG. 1 is a block diagram of a phase locked filter in accordance with an exemplary embodiment of the present invention.

With reference to FIG. 1, a frequency source system 10 is coupled to an oscillator, such as, a voltage-controlled oscillator (VCO) 12. Frequency source system 10 includes a prescaler or divider 14, and a phase locked filter 15. Filter 15 includes a signal splitter 16, a phase comparator circuit 18, a voltage-tuned band pass filter 24, and a phase splitter 28.

Voltage-controlled oscillator 12 is coupled to an input of divider 14. Divider 14 has an output coupled to signal splitter 16. Oscillator 12 is preferably a varactor-tuned oscillator. Oscillator 12 and divider 14 can be replaced by other signal sources or synthesizer, such as, a direct digital source (DDS). Divider 14 can be programmable to frequency-divide the signal from oscillator 12 by a variable amount. Alternatively, divider 14 can be a fixed divider.

Signal splitter 16 has two outputs. One output of signal splitter 16 is coupled to a filter input 32 of filter 24; the other output of splitter 16 is coupled to an input 34 of phase comparator circuit 18. A filter output 36 of filter 24 is coupled to phase splitter 28 which also has two outputs, one output is coupled to an output 48; the other output is coupled to phase input 46 of circuit 18. Phase comparator circuit 18 has an output 42 coupled to a control input 45 of filter 24.

Splitters 16 and 28 can be any circuit or device for splitting a signal into two signal paths. Splitters 16 and 28 can be a hybrid splitter, a transformer-type splitter, or a Wilkenson microstrip-type splitter. Phase comparator circuit 18 includes a phase detector 80 and an integrator 84. Phase detector 80 is preferably a phase frequency detector containing two or more D-type flipflops for detecting edges. Integrator 84 preferably includes an operational amplifier and a capacitor.

Filter 24 is preferably a band pass filter which is tunable to a particular center frequency. The characteristics and operations of filter 24 are discussed in more detail below with reference to FIGS. 2 and 3.

In operation, phase locked filter 15 is coupled to divider 14 for generating a lower noise, high frequency signal at output 48. The high frequency signal can be a radio frequency, VHF, UHF, or other spectrum signal. In this way, divider 14 can provide transmit signals through phase locked filter 15 to output 48 because filter 24 removes noise or spurious signals from the signal provided by divider 14. Thus, a radio, a wireless unit, or other communication device (not shown) can utilize fewer voltage-controlled oscillators, such as, voltage-controlled oscillator 12, to generate various frequency signals. In conventional devices, several voltage-controlled oscillators are required to provide signal sources because dividers tend to be too noisy.

Divider 14 provides the source signal to splitter 16. The source signal can be various frequencies, waveform shapes, and amplitudes and is preferably a 30 MHz to 1 GHz square wave or analog signal. Splitter 16 provides the source signal to input 32 of filter 24 and to input 34 of phase comparator circuit 18. Filter 24 provides a filtered source signal at output 36 to splitter 28. Splitter 28 provides the filtered source signal to output 48 and to input 46 of phase comparator circuit 18.

Phase comparator circuit 18 compares the phases of the signal provided at input 46 and at input 34 and produces a control signal at output 42 in response to the phase difference. The control signal is provided to input 45 of filter 24 and adjusts the center frequency associated with filter 24. In this way, the center frequency of band pass filter 24 is set so that there is no phase difference between the source signal provided at input 32 and the filtered source signal provided at output 36. Thus, filter 24 is set to have a center frequency equal to the frequency of the source signal. When centered at the center frequency of the source signal, filter 24 can provide a clean signal at output 48. As the frequency of the source signal changes due to channel selection or other changes, the center frequency of filter 24 will be adjusted to match the frequency of the source signal.

The control signal is preferably clamped to prevent the loss of lock for filter 24. The control signal can be clamped to set the center frequency within a particular range about a desired center frequency.

Phase locked filter 15 is different than conventional filters which utilize a variable band pass filter coupled to a prom and digital-to-analog converter (DAC). In these devices, the prom and DAC are utilized to control the center frequency of the band pass filter. However, the prom and DAC provide additional product expense as well as testing and verification expense.

Figure 2:
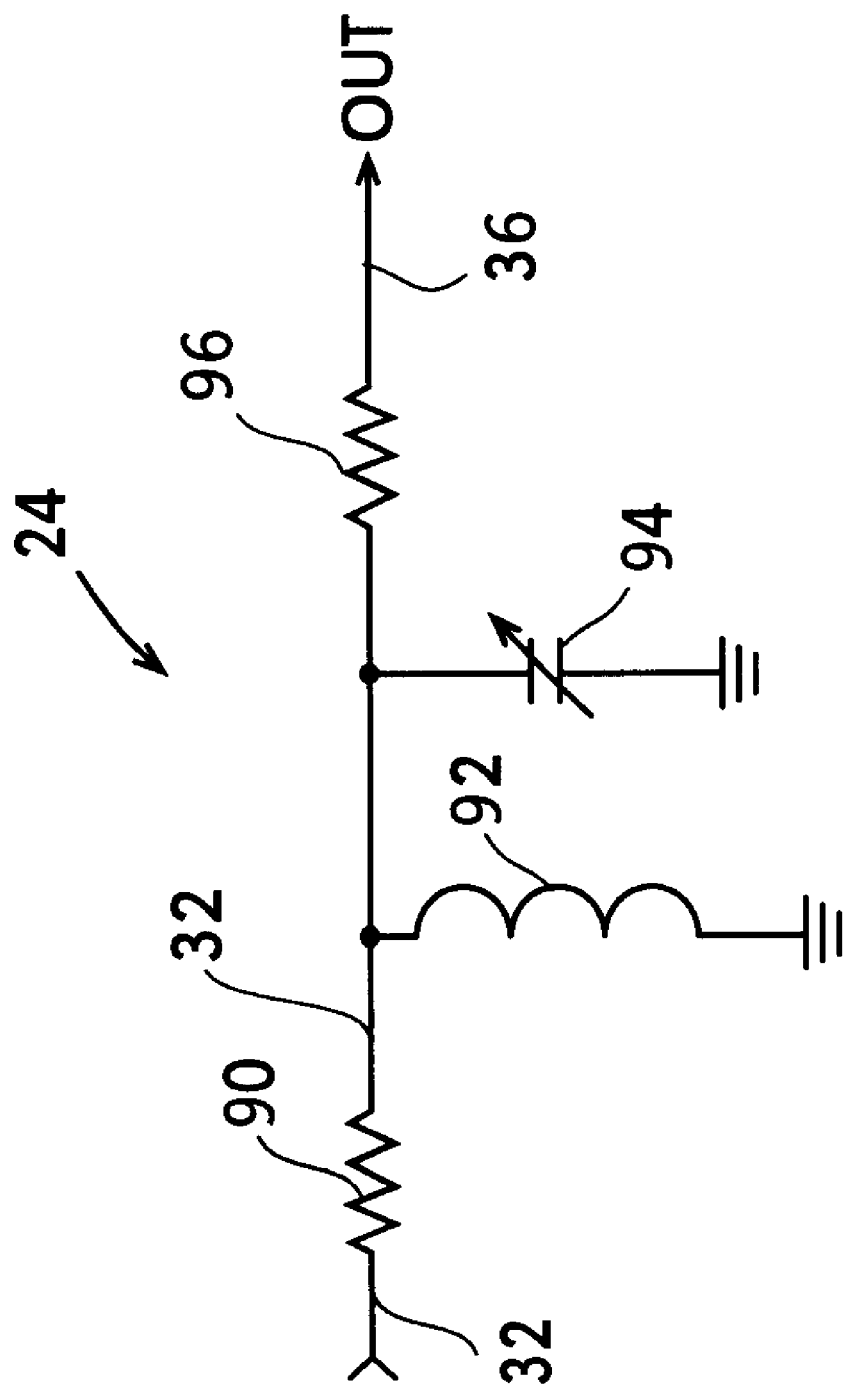
FIG. 2 is an electrical schematic diagram of the voltage-tuned band pass filter illustrated in FIG. 1.

With reference to FIG. 2, filter 24 includes a resistive element 90, an inductive element 92, a varactor 94, and a resistive element 96. Varactor 94 preferably responds to the control signal provided at input 45 (not shown in FIG. 3) and changes capacitance to effect changes in frequency and in phase response. Varactor 94 is a semiconductor variable capacitance diode. Alternatively, filter 24 can be manufactured from other devices which can change frequency response and phase response in accordance with a control signal. Thus, system 10 provides a convenient and inexpensive apparatus for generating wide band signals from divider 14 coupled to VCO 12.

Figure 3:
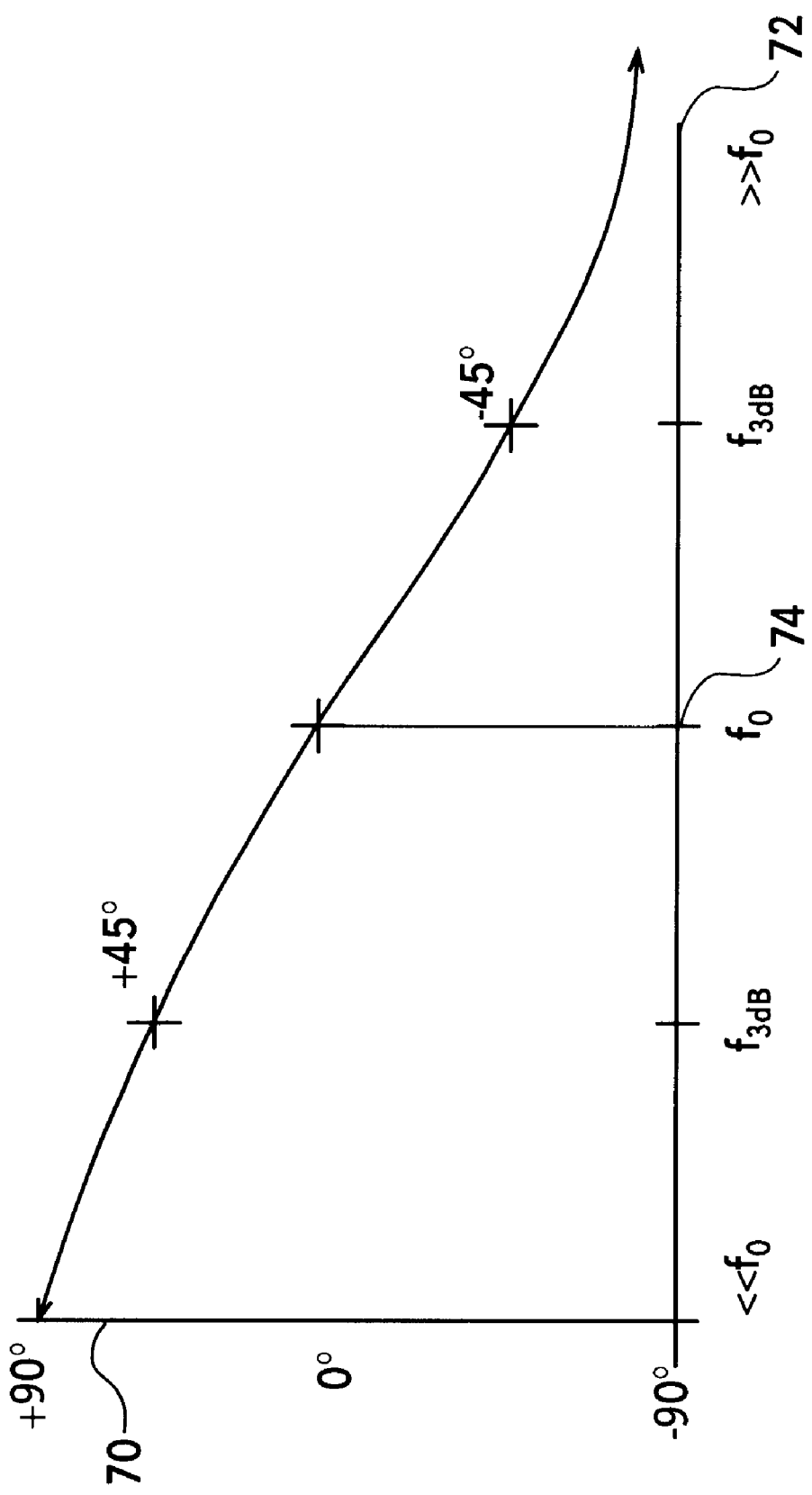
FIG. 3 is a schematic representation of the band pass filter phase response associated with the voltage-tuned band pass filter.

With reference to FIG. 3, the band pass filter phase response associated with filter 24 is shown, where a Y-axis 70 indicates phase difference, and an X-axis 72 indicates frequency. At a center frequency 74 of filter 24 (as set by the control signal from phase comparator circuit 18 in FIG. 1), the phase response of filter 24 is zero (e.g., there is no zero-phase difference between the source signal at input 32 and the filtered source signal at output 36). As the frequency of the source signal differs between center frequency 74 of the band pass filter 24, the phase difference increases. For example, the more the frequency of the source signal is away from center frequency 74, the greater the phase difference.

Filter 24, therefore, has a known phase shift or phase response which is a function of a voltage provided at input 45. With reference to FIG. 1, phase comparator circuit 18 determines the phase difference and adjusts the center frequency of filter 24 in the appropriate manner so that center frequency 74 is set to a frequency provided at input 32. As a result, filter 24 phase locks the source signal to center frequency 74 of the source signal provided by divider 14. Thus, filter 24 is tuned to an appropriate center frequency 74 so the source signal can be utilized as a carrier frequency in a transmit operation.

It is understood that, while the detailed drawings, specific examples, and particular component values given describe preferred embodiments of the present invention, they serve the purpose of illustration only. The apparatus of the invention is not limited to the precise details and conditions disclosed. Further, although particular phase detectors, comparators, and filters are shown, various other components could be utilized. Other substitutions, modifications, changes, and omissions may be made in the design, operating conditions, and arrangement of the preferred embodiments without departing from the spirit of the invention as expressed in the appended claims.

What is claimed is:

1. A high frequency signal source comprising:
    a voltage controlled oscillator for providing a high frequency source signal;
    a divider coupled to the voltage controlled oscillator and receiving the source signal, the divider providing a divided high frequency signal; and
    a phase locked filter including:
        a first signal splitter having a source input, a first output, and a second output the source input being coupled to the divider to receive the divided high frequency signal;

a band pass filter having a signal input, a signal output, and a control input, the signal input being coupled to the first output, the band pass filter having a frequency response in accordance with a control signal at the control input;

a second signal splitter having a filter input, a third output, and a fourth output, the filter input being coupled to the signal output; and a phase control circuit having a first phase input, a second phase input, and a phase output, the first phase input being coupled to the second output, the second phase input being coupled to the third output, the phase output being coupled to the control input.

2. The source of claim 1, wherein the phase control circuit includes a phase comparator and an integrator.

3. The source of claim 2, wherein the phase comparator is coupled to the first and the second phase inputs.

4. The source of claim 3, wherein the integrator has an integrator output coupled to the phase output.

5. The source of claim 4, wherein the integrator includes an amplifier and a capacitor.

6. The source of claim 1, wherein the band pass filter has a phase response over the frequency response, the phase control circuit adjusting a center frequency of the band pass filter to reduce a phase difference at the first phase input and at the second phase input.

7. The source of claim 1 wherein the high frequency divided signal is a VHF signal.

8. The source of claim 1, wherein the band pass filter further includes a varactor having a varactor control input coupled to the control input.

9. The source of claim 8, wherein the band pass filter further includes an inductor in parallel with the varactor.

10. A VHF or higher frequency synthesizer comprising:

a high frequency source a divider having a divider input coupled to the high frequency source and a divider output; and a phase locked filter comprising:

a filter having a filter input, a control input, and a filter output, the filter input being coupled to the divider output, the filter having a frequency response indicated by a control signal provided at the control input, the filter having a phase response over the frequency response; and a phase comparator circuit having a first phase input, a second phase input, and a phase output, the first phase input being coupled to the divider output, the second phase input being coupled to the filter output, the phase output being coupled to the control input, whereby the phase comparator provides the control signal at the phase output to reduce a difference in phase between signals at the first phase input and at the second phase input.

11. The synthesizer of claim 10, wherein the phase comparator circuit includes an integrator and a comparator.

12. The phase locked filter synthesizer of claim 10 further comprising:

a first signal splitter coupled between the filter input and the divider output.

13. The synthesizer of claim 12, further comprising:

a second signal splitter coupled between the filter output and the second phase input.

14. The synthesizer of claim 11, wherein the integrator includes an amplifier and a capacitor.

15. The synthesizer of claim 10, wherein the filter is a band pass filter.

16. The synthesizer of claim 15, wherein the chosen frequency is a center frequency.

17. The synthesizer of claim 16, wherein the filter has a zero phase difference response at the center frequency.

18. A high frequency synthesizer, comprising:

a voltage controlled high oscillator;

a divider coupled to the oscillator for providing a divided high frequency signal to an input; and a phase locked filter comprising:

a filter means for filtering a signal at the input and for providing a filtered signal at an output in accordance with a band pass frequency response related to a center frequency indicated by a control signal provided at a control input, the filter means having a phase response of zero at the center frequency; and a phase comparator means for receiving the signal and the filtered signal and for generating the control signal in accordance with a phase difference between the signal and the filtered signal, whereby the phase comparator means provides the control signal at the phase output to reduce the phase difference.

19. The synthesizer of claim 18, wherein the phase comparator means includes a phase comparator and an integrator.

20. The synthesizer of claim 19, wherein the integrator includes an amplifier and a capacitor.

* * * * *